United States Patent
Chen et al.

(12) United States Patent (10) Patent No.: US 9,646,943 B1
(45) Date of Patent: May 9, 2017

(54) CONNECTOR STRUCTURE AND METHOD OF FORMING SAME

(71) Applicant: Taiwan Semiconductor Manufacturing Company, Ltd., Hsin-Chu (TW)

(72) Inventors: Chen-Shien Chen, Zhubei (TW); Sheng-Yu Wu, Hsin-Chu (TW); Mirng-Ji Lii, Sinpu Township (TW); Chita Chuang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/986,154

(22) Filed: Dec. 31, 2015

(51) Int. Cl.
*H01L 21/44* (2006.01)
*H01L 23/00* (2006.01)

(52) U.S. Cl.
CPC ............. *H01L 24/11* (2013.01); *H01L 24/16* (2013.01); *H01L 24/81* (2013.01); *H01L 2224/11906* (2013.01); *H01L 2224/16014* (2013.01); *H01L 2224/16145* (2013.01)

(58) Field of Classification Search
CPC .................................................. H01L 21/4853
USPC ........................................................ 438/110
See application file for complete search history.

(56) References Cited

U.S. PATENT DOCUMENTS

| | | | | |
|---|---|---|---|---|
| 7,550,316 | B2 * | 6/2009 | Kang | H01L 21/6835 438/108 |
| 7,723,225 | B2 * | 5/2010 | Lin | H01L 24/14 438/612 |
| 8,304,905 | B2 * | 11/2012 | Matsui | H01L 24/13 438/613 |
| 8,980,739 | B2 * | 3/2015 | Cho | H01L 24/11 438/614 |

* cited by examiner

*Primary Examiner* — Chandra Chaudhari
(74) *Attorney, Agent, or Firm* — Slater Matsil, LLP (57) ABSTRACT

Connector structures and methods of forming the same are provided. A method includes forming a first patterned passivation layer on a workpiece, the first patterned passivation layer having a first opening exposing a conductive feature of the workpiece. A seed layer is formed over the first patterned passivation layer and in the first opening. A patterned mask layer is formed over the seed layer, the patterned mask layer having a second opening exposing the seed layer, the second opening overlapping with the first opening. A connector is formed in the second opening. The patterned mask layer is partially removed, an unremoved portion of the patterned mask layer remaining in the first opening. The seed layer is patterned using the unremoved portion of the patterned mask layer as a mask.

20 Claims, 9 Drawing Sheets

CONNECTOR STRUCTURE AND METHOD OF FORMING SAME

BACKGROUND

Modern integrated circuits are made up of literally millions of active devices such as transistors and capacitors. These devices are initially isolated from each other, but are later interconnected together to form functional circuits. Typical interconnect structures include lateral interconnections, such as metal lines (wirings), and vertical interconnections, such as vias and contacts. Interconnections are increasingly determining the limits of performance and the density of modern integrated circuits. On top of the interconnect structures, bond pads are formed and exposed on the surface of the respective chip. Electrical connections are made through bond pads to connect the chip to a package substrate or another die. Bond pads can be used for wire bonding or flip-chip bonding. Flip-chip packaging utilizes bumps to establish electrical contact between a chip's input/output (I/O) pads and the substrate or lead frame of the package. Structurally, a bump actually contains the bump itself and an "under bump metallurgy" (UBM) located between the bump and an I/O pad. During some packaging processes, bumps of smaller size are also used to establish electrical contact between the chip's I/O pads and I/O pads of other chips, such as small-scale chips or discrete devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1A-7B are top and cross-sectional views of various processing steps during fabrication of connector structures on integrated circuit dies in accordance with some embodiments.

DETAILED DESCRIPTION

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Description is made with respect to various embodiments in a specific context, namely connector structures of integrated circuit dies and methods of forming the same. In addition, methods of bonding one or more discrete devices to integrated circuit dies using connector structures are also provided below. Before addressing the illustrated embodiments specifically, certain advantageous features and aspects of the disclosed embodiments will be addressed generally. Various embodiments described below allow for minimizing or eliminating undercut formation between connector structures and corresponding contact pads of integrated circuit dies. By controlling undercut formation, failures of connector structures, such as formation of cracks between connector structures and corresponding contact pads of integrated circuit dies, may be reduced or avoided. Various embodiments described below are particularly advantageous for forming connector structures of a fine pitch and size, since connector structures of a fine pitch and size are more prone to failure due to undercut formation.

FIGS. 1A-7B are top and cross-sectional views of various processing steps during fabrication of connector structures on integrated circuit dies in accordance with some embodiments, wherein an "A" figure represents a top view and a "B" figure represents a cross-sectional view along the B-B' line of the respective "A" figure.

Figure 1A:
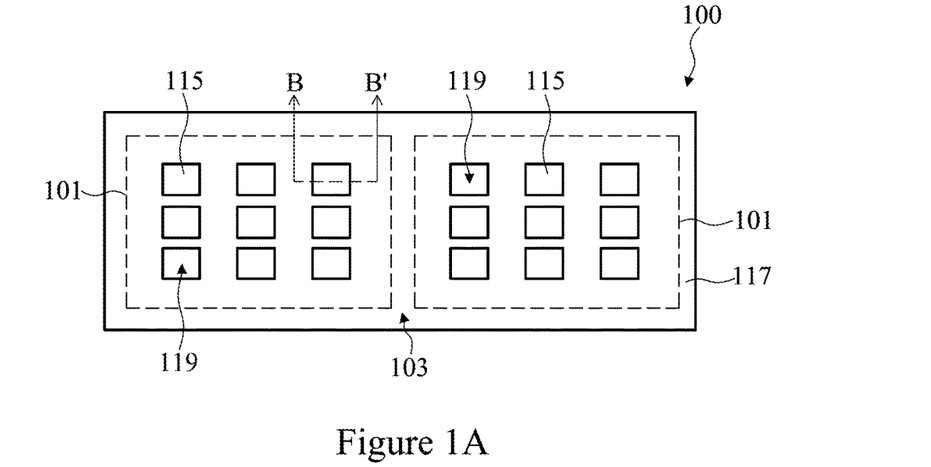
Figure 1B:
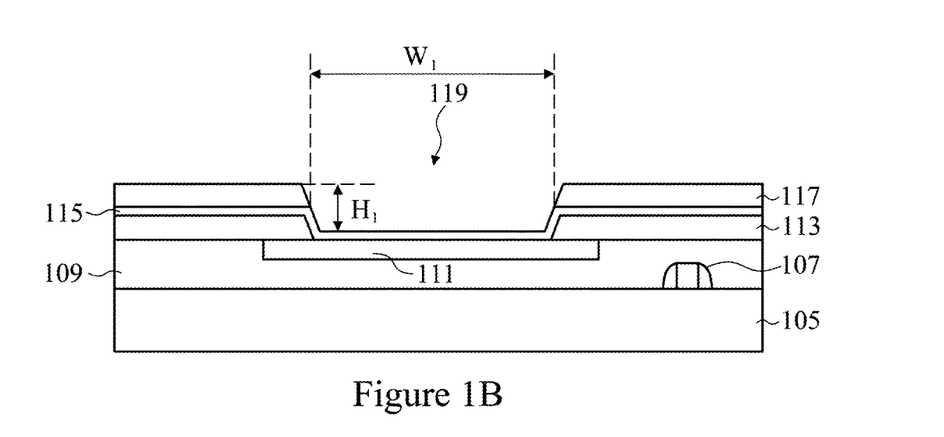

Referring first to FIGS. 1A and 1B, a portion of a workpiece 100 having die regions 101 separated by scribe lines 103 (also referred to as dicing lines or dicing streets) is illustrated. As described below in greater detail, the workpiece 100 will be diced along the scribe lines 103 to form individual integrated circuit dies (such as integrated circuit dies 701 illustrated in FIGS. 7A and 7B). In some embodiments, the workpiece 100 comprises a substrate 105, one or more active and/or passive devices 107 on the substrate 105, and one or more metallization layers 109 over the substrate 105 and the one or more active and/or passive devices 107. In some embodiments, the substrate 105 may be formed of silicon, although it may also be formed of other group III, group IV, and/or group V elements, such as silicon, germanium, gallium, arsenic, and combinations thereof. The substrate 105 may also be in the form of silicon-on-insulator (SOI). The SOI substrate may comprise a layer of a semiconductor material (e.g., silicon, germanium and/or the like) formed over an insulator layer (e.g., buried oxide and/or the like), which is formed on a silicon substrate. In addition, other substrates that may be used include multi-layered substrates, gradient substrates, hybrid orientation substrates, any combinations thereof and/or the like. In other embodiments, the substrate 105 may comprise a dielectric material such as silicon oxide, aluminum oxide, the like, or a combination thereof.

In some embodiments, the one or more active and/or passive devices 107 may include various n-type metal-oxide semiconductor (NMOS) and/or p-type metal-oxide semiconductor (PMOS) devices such as transistors, capacitors, resistors, diodes, photo-diodes, fuses and/or the like. The one or more metallization layers 109 may include an inter-layer dielectric (ILD)/inter-metal dielectric layers (IMDs) (not individually shown) formed over the substrate 105. The ILD/IMDs may be formed, for example, of a low-K dielectric material, such as phosphosilicate glass (PSG), borophosphosilicate glass (BPSG), FSG, $SiO_xC_y$, Spin-On-Glass, Spin-On-Polymers, silicon carbon material, compounds thereof, composites thereof, combinations thereof, or the like, by any suitable method known in the art, such as a spin-on coating method, chemical vapor deposition (CVD), plasma enhanced CVD (PECVD), the like, or a combination thereof. In some embodiments, interconnect structures such as conductive lines and vias may be formed in the ILD/IMDs using, for example, a damascene process, a dual damascene process, or the like. In some embodiments, interconnect structures may comprise copper, a copper alloy, silver, gold, tungsten, tantalum, aluminum, or the like. In some embodiments, the interconnect structures may provide electrical connections between the one or more active and/or passive devices 107 formed on the substrate 105.

In some embodiments, a plurality of conductive features 111 are formed over the one or more metallization layers 109. In the illustrated embodiment, the conductive features 111 are conductive lines and/or vias of the topmost of the one or more metallization layers 109 as illustrated in FIG. 1B. In other embodiments, the conductive features 111 may be contact pads formed on the one or more metallization layers 109 and may be electrically coupled to the one or more active and/or passive devices 107 through various interconnect structures of the one or more metallization layers 109. In some embodiments, the contact pads may comprise a conductive material such as aluminum, copper, tungsten, silver, gold, the like, or a combination thereof. In some embodiments, a conductive material may be formed over the one or more metallization layers 109 using, for example, physical vapor deposition (PVD), atomic layer deposition (ALD), electro-chemical plating, electroless plating, the like, or a combination thereof. Subsequently, the conductive material is patterned to form the contact pads. In some embodiments, the conductive material may be patterned using suitable photolithography and etching techniques. As described below in greater detail, connector structures will be formed on and electrically coupled to the conductive features 111.

Referring further to FIGS. 1A and 1B, in some embodiments, a first passivation layer 113 is formed over the substrate 105 and the conductive features 111. In some embodiments, the first passivation layer 113 may comprise one or more layers of photo-patternable dielectric materials such as polybenzoxazole (PBO), polyimide (PI), benzocyclobutene (BCB), or the like, and may be formed using a spin-on coating process, or the like. Such photo-patternable dielectric materials may be easily patterned using similar photolithography methods as a photoresist material. In other embodiments, the first passivation layer 113 may comprise one or more layers of non-photo-patternable dielectric materials such as silicon nitride, silicon oxide, phosphosilicate glass (PSG), borosilicate glass (BSG), boron-doped phosphosilicate glass (BPSG), or the like, and may be formed using CVD, PVD, ALD, a spin-on coating process, the like, or a combination thereof.

Openings are formed in the first passivation layer 113 to expose the conductive features 111. In some embodiments wherein the first passivation layer 113 is formed of a photo-patternable dielectric material, the first passivation layer 113 may be patterned using similar photolithography methods as a photoresist material. In other embodiments in which the first passivation layer 113 is formed of a non-photo-patternable dielectric material, a photoresist material (not shown) is formed over the first passivation layer 113. The photoresist material is subsequently irradiated (exposed) and developed to remove a portion of the photoresist material. Subsequently, exposed portions of the first passivation layer 113 are removed using, for example, a suitable etching process to form the openings. In some embodiments wherein the first passivation layer 113 is formed of silicon oxide, the first passivation layer 113 is etched using, for example, buffered hydrofluoric acid (HF). In some embodiments in which the first passivation layer 113 is formed of silicon nitride, the first passivation layer 113 is etched using, for example, hot phosphoric acid ($H_3PO_4$). Subsequently, the photoresist material may be removed using, for example, an ashing process followed by a wet clean process. In some embodiments, a thickness of the first passivation layer 113 is between about 0.6 µm and about 1.2 µm.

In some embodiments, a protective layer 115 is formed over the first passivation layer 113 and in the openings of the first passivation layer 113. The protective layer 115 protects the conductive features 111 from harmful processes such as, for example, oxidation. In some embodiments, the protective layer 115 may comprise metal nitrides such as, for example, TaN, and may be formed using CVD, PVD, ALD, the like, or a combination thereof. In some embodiments, a thickness of the protective layer 115 is between about 0.06 µm and about 0.2 µm. In some embodiments, the protective layer 115 may be patterned to avoid shorting of the conductive features 111. In such embodiments, a portion of the protective layer 115 over the conductive feature 111 as illustrated in FIG. 1B is not in electrical contact with other portions of the protective layer 115 formed over other conductive features 111 illustrated in FIG. 1A. Accordingly, the patterned protective layer 115 does not couple the conductive features 111 to one another electrically. In some embodiments, the protective layer 115 may be patterned using suitable lithography methods.

In some embodiments, a second passivation layer 117 is formed over the protective layer 115 and patterned to expose portions of the protective layer 115 formed on bottoms and sidewalls of the openings in the first passivation layer 113. In some embodiments, the second passivation layer 117 may be formed and patterned using similar materials and methods as the first passivation layer 113 and the description is not repeated herein. As illustrated in FIGS. 1A and 1B, openings in the first passivation layer 113 and openings in the second passivation layer 117 form combined openings 119, which are partially lined by the protective layer 115. In some embodiments, the openings 119 may have a height $H_1$ between about 3 µm and about 4 µm and a width $W_1$ between about 20 µm and about 30 µm. In the illustrated embodiment, sidewalls of the openings in the second passivation layer 117 are aligned with corresponding sidewalls of the openings in the first passivation layer 113. In other embodiments, sidewalls of the openings in the second passivation layer 117 may be offset with respect to the corresponding sidewalls of the openings in the first passivation layer 113.

In some embodiments, exposed surfaces of the protective layer 115 and the second passivation layer 117 are cleaned before performing subsequent processing steps on the workpiece 100. The surface cleaning process may include methods with direct and non-direct contact with the exposed surfaces of the protective layer 115 and the second passivation layer 117, such as RCA clean, cryogenic cleaning, mechanical wiping and scrubbing, etching in a gas, plasma or liquid, ultrasonic and megasonic cleaning, laser cleaning, and the like.

Figure 2A:
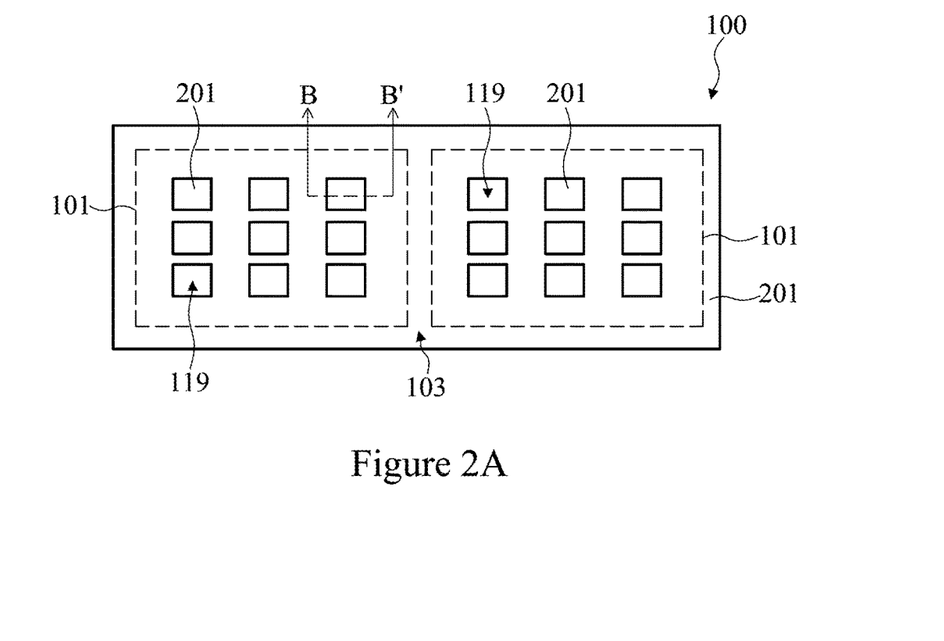
Figure 2B:
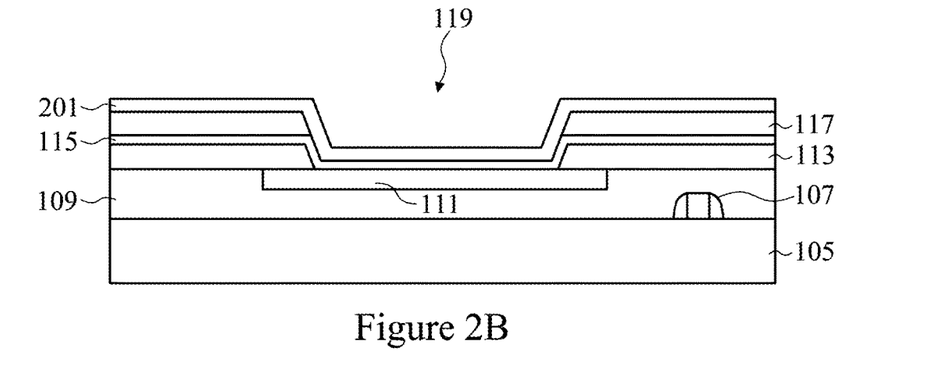

Referring to FIGS. 2A and 2B, a seed layer 201 is formed over the second passivation layer 117 and on bottoms and sidewalls of the openings 119. The seed layer 201 may comprise one or more layers of copper, titanium, nickel, gold, the like, or a combination thereof, and may be formed using an electro-chemical plating process, ALD, PVD, sputtering, the like, or a combination thereof. In some embodiments, the seed layer 201 may comprise a layer of copper having a thickness between about 0.05 μm and about 0.5 μm formed over a layer of titanium having a thickness between about 0.05 μm and about 0.5 μm. As described below in greater detail, connectors are formed on and are electrically coupled to the seed layer 201 in the openings 119.

Figure 3A:
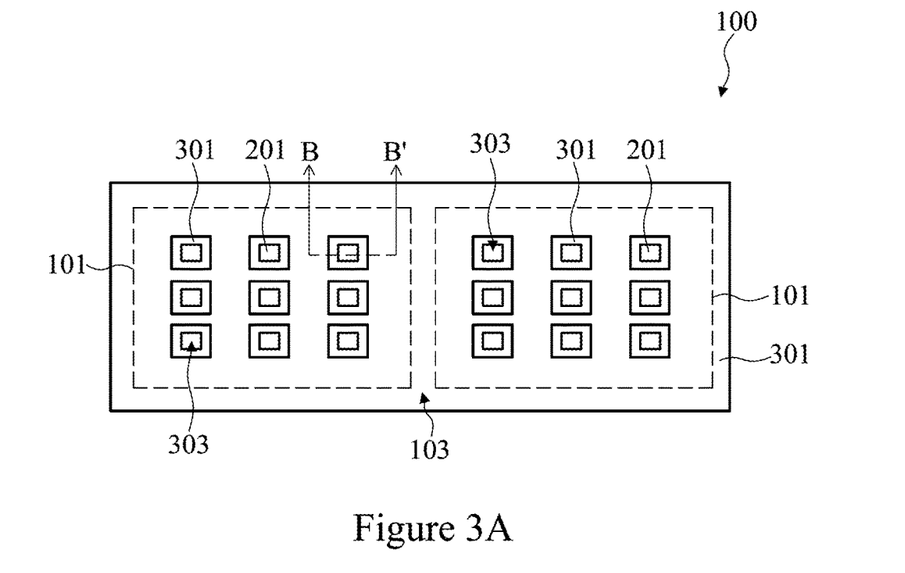
Figure 3B:
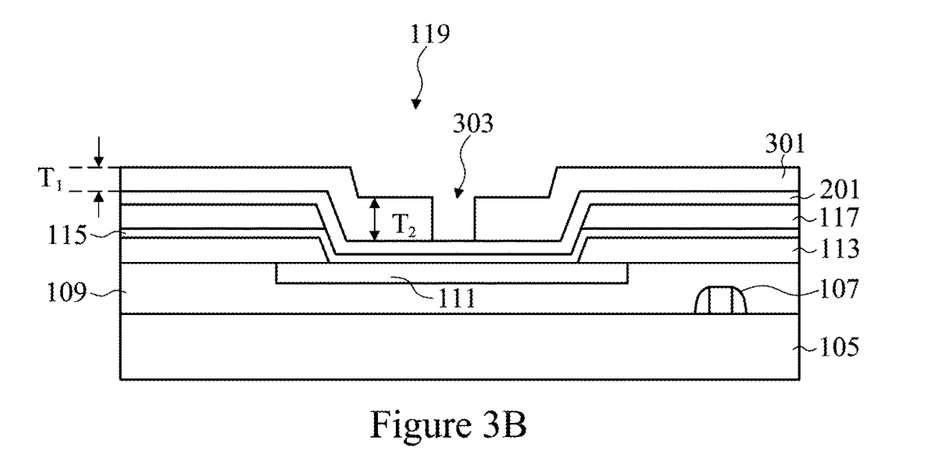

Referring to FIGS. 3A and 3B, in some embodiments, a photoresist layer 301 is formed over the seed layer 201 and is patterned to form openings 303 within corresponding openings 119. Alternatively, other suitable masking materials may be used instead of the photoresist layer 301. In some embodiments, the photoresist layer 301 is formed using a spin-on coating method, or the like. Due to uneven topography, a thickness of the photoresist layer 301 changes depending on a location. In some embodiments, the photoresist layer 301 has a first thickness $T_1$ over the second passivation layer 117 and a second thickness $T_2$ within the openings 119 such that the second thickness $T_2$ is greater than the first thickness $T_1$. In some embodiments, the first thickness $T_1$ is between about 0.5 μm and about 2 μm or more, and the second thickness $T_2$ is between about 4.5 μm and about 6 μm or more. Subsequently, the photoresist layer 301 is irradiated (exposed) and developed to remove portions of the photoresist layer 301 and form the openings 303 in the photoresist layer 301. The openings 303 expose portions of the seed layer 201 in the openings 119.

Figure 4A:
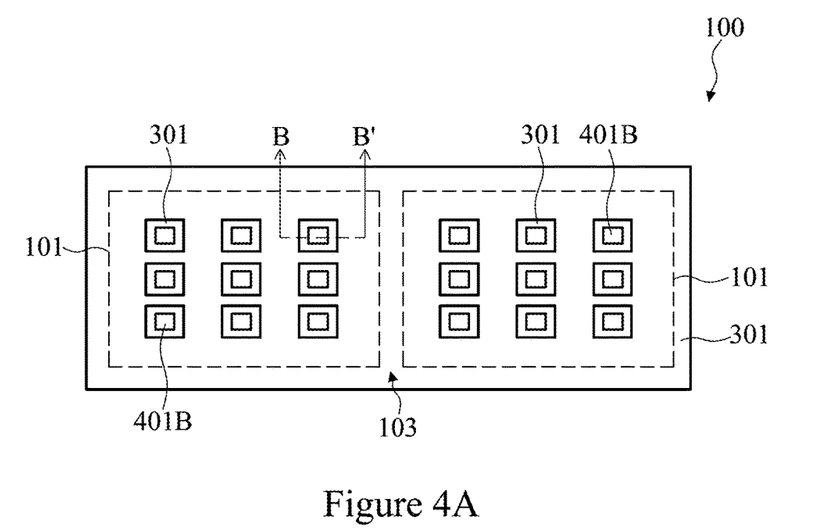
Figure 4B:
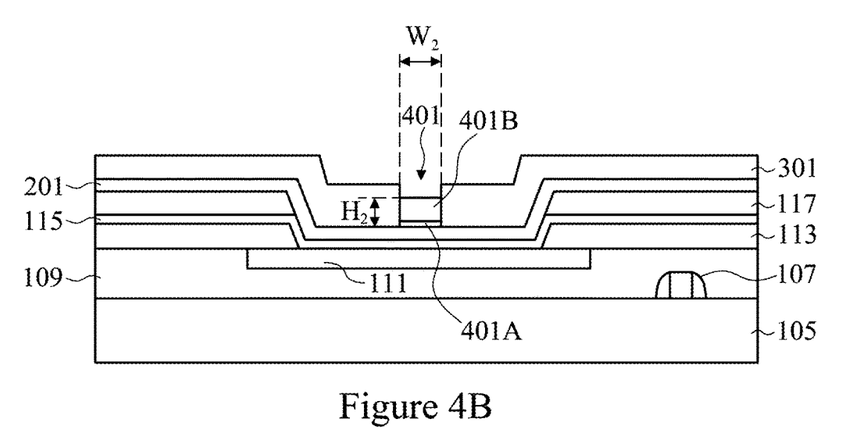

Referring to FIGS. 4A and 4B, connectors 401 are formed in the openings 303 of the photoresist layer 301. The connectors 401 may include conductive materials such as solder, copper, aluminum, gold, nickel, silver, palladium, tin, indium, the like, or a combination thereof. In some embodiments in which the connectors 401 are solder bumps, the connectors 401 may be formed by initially forming a layer of solder through commonly used methods such as evaporation, electroplating, printing, solder transfer, ball placement, or the like. In other embodiments, the connectors 401 may be pillars formed by a sputtering, printing, electro-chemical plating, electroless plating, PVD, or the like. The pillars may be solder free and have substantially vertical sidewalls. In the illustrated embodiment, the connectors 401 have first portions 401A formed of nickel and second portions 401B formed of indium. In some embodiments, the connectors 401 have a height $H_2$ between about 0.2 μm and about 2 μm, and a width $W_2$ between about 2 μm and about 5 μm. As described below in greater detail, the connectors 401 are used to mechanically and electrically bond discrete devices (such as discrete devices 801 illustrated in FIGS. 8A and 8B) to integrated circuit dies formed from the workpiece 100.

Figure 5A:
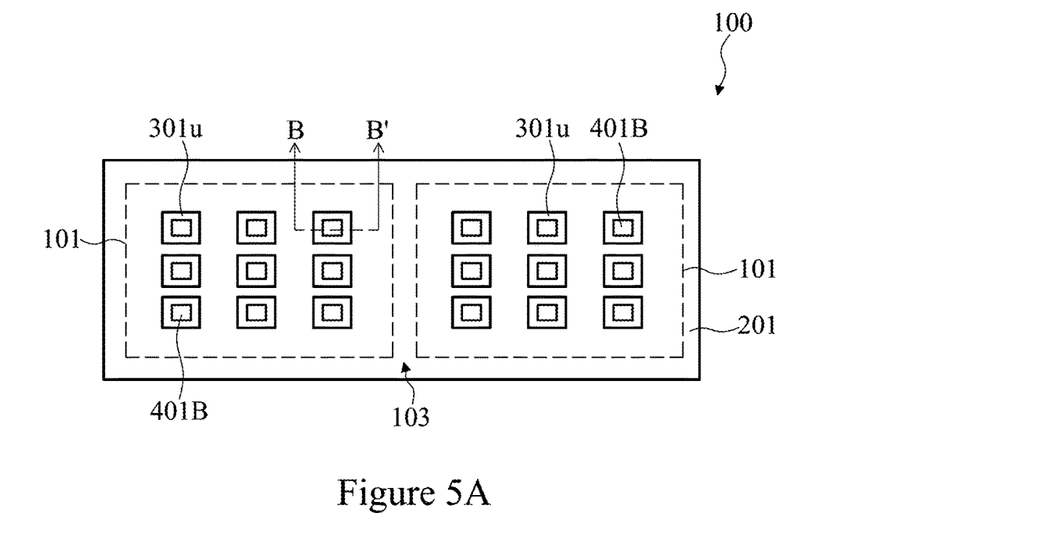
Figure 5B:
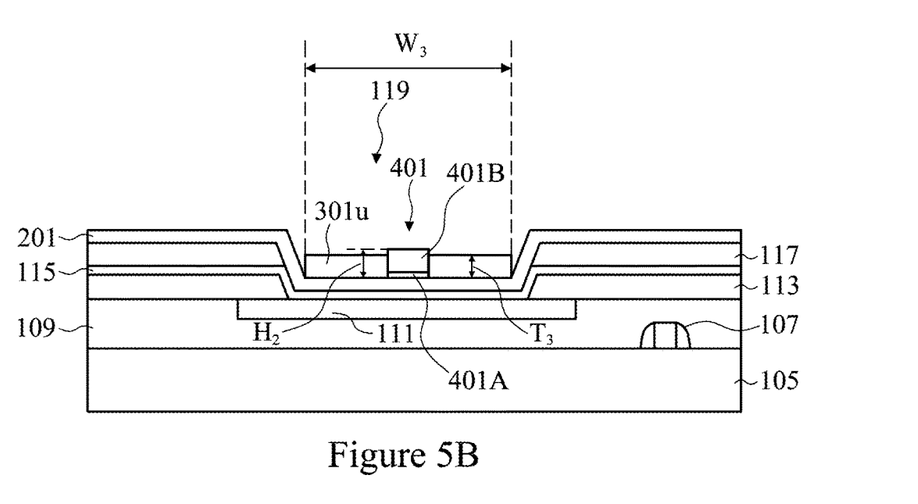

Referring to FIGS. 5A and 5B, portions of the photoresist layer 301 deposited over the second passivation layer 117 are removed and unremoved portions 301u of the photoresist layer 301 remain in the openings 119. As described below in greater detail, the unremoved portions 301u of the photoresist layer 301 protect portions of the seed layer 201 in the openings 119 from a subsequent etching process. In some embodiments, the photoresist layer 301 is partially removed using a dry etching process such as, for example, a reactive ion etching (RIE) process, or the like. Alternatively, other photoresist stripping methods may be also used. The dry etching process may be performed for a specific duration such that a layer of thickness T1 (see FIG. 3B) is removed from the photoresist layer 301. Accordingly, the unremoved portions 301u of the photoresist layer 301 having a thickness $T_3$ equal to $T_2$-$T_1$ remain in the openings 119. In the illustrated embodiment, the height $H_2$ of the connectors 401 are greater than the thickness $T_3$ of the unremoved portions 301u of the photoresist layer 301. In other embodiments, the height $H_2$ of the connectors 401 may be less than or equal to the thickness $T_3$ of the unremoved portions 301u of the photoresist layer 301. In some embodiments, the unremoved portions 301u of the photoresist layer 301 have a width $W_3$ between about 10 μm and about 20 μm or more.

Figure 6A:
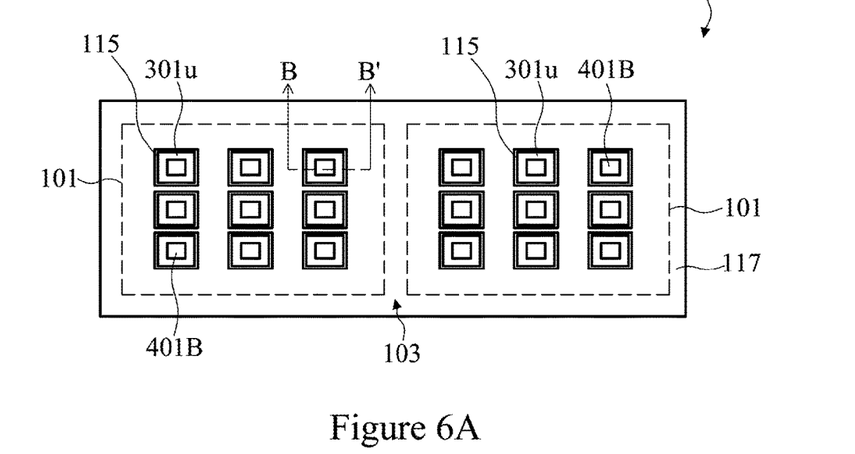
Figure 6B:
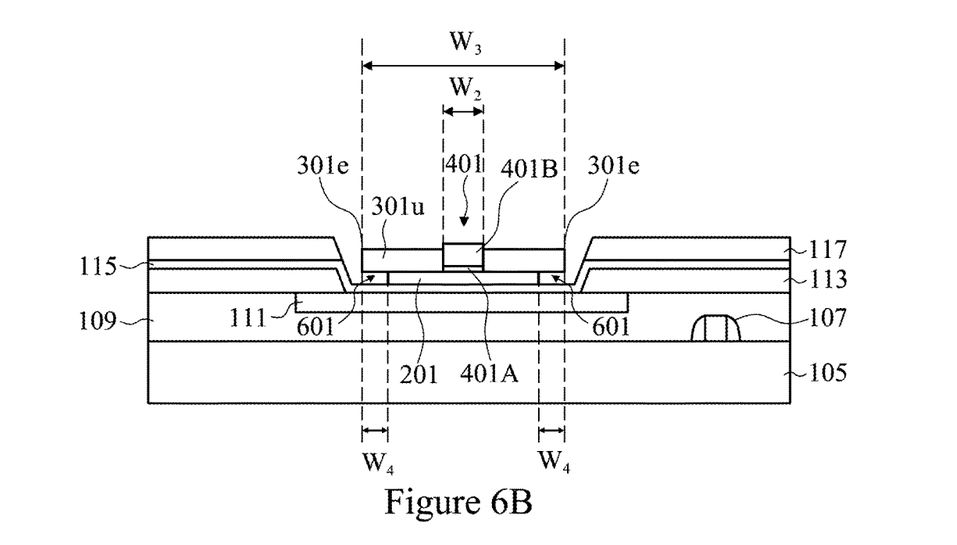

Referring to FIGS. 6A and 6B, portions of the seed layer 201 not protected by the unremoved portions 301u of the photoresist layer 301 are removed. In some embodiments, unprotected portions of the seed layer 201 are removed using a suitable etching process. In some embodiments in which the seed layer 201 comprises a copper layer formed over a titanium layer, the seed layer 201 may be etched using, for example, a mixture of $FeCl_3$, HCl, and $H_2O$ (for etching copper) and a mixture of $H_2O_2$, HF, and $H_2O$ (for etching titanium). In some embodiments, the seed layer 201 may be overetched and undercuts 601 may be formed below the unremoved portions 301u of the photoresist layer 301 near edges 301e of the unremoved portions 301u of the photoresist layer 301. In some embodiment, the undercuts 601 may have a width $W_4$ between about 0.5 μm and 1 μm. To avoid formation of undercuts below the connectors 401, in some embodiments, the width $W_3$ of the unremoved portions 301u of the photoresist layer 301 may be chosen to be larger than or equal to a sum of the width $W_2$ of the connectors 401 and twice the width $W_4$ of the undercuts 601. As illustrated in FIG. 6B by choosing such dimensions, undercuts are not formed between the connectors 401 and corresponding conductive features 111.

Figure 7A:
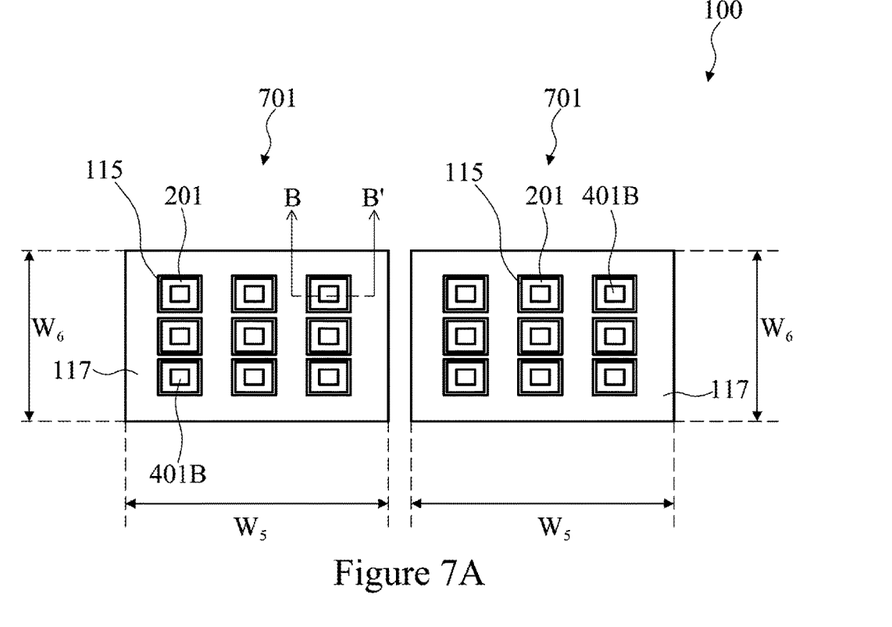
Figure 7B:
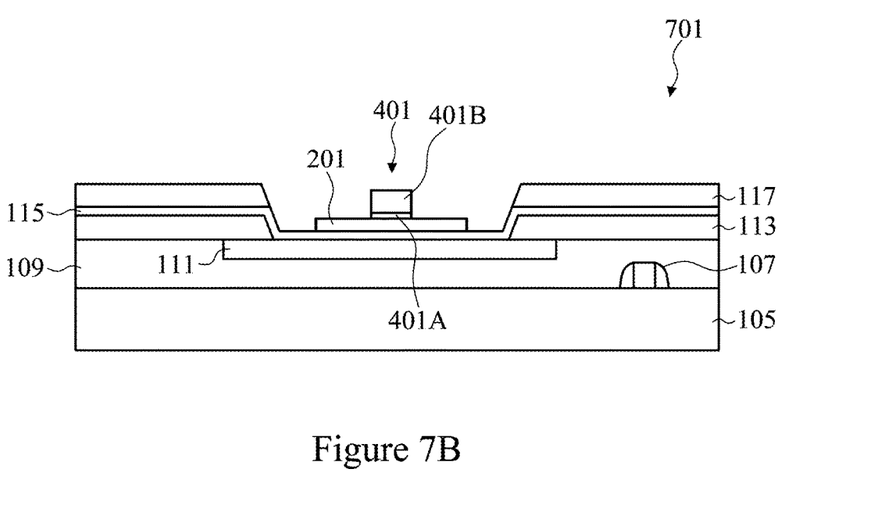

Referring to FIGS. 7A and 7B, the unremoved portions 301u of the photoresist layer 301 are removed. In some embodiments, the unremoved portions 301u of the photoresist layer 301 are removed using any suitable stripping process such as etching, ashing, or the like. The remaining portions of the seed layer 201 act as underbump metallizations (UBMs) for corresponding connectors 401 and may be also referred to as UBMs 201. Subsequently, the workpiece 100 is diced along the scribe lines 103 to form individual integrated circuit dies 701. In some embodiments, the workpiece 100 may be diced using, for example, etching, sawing, laser ablation, the like, or a combination thereof. Subsequently, each of the integrated circuit dies 701 may be tested to identify known good dies (KGDs) for further processing. In some embodiment, the integrated circuit dies 701 have a first width $W_5$ of about 32 mm and a second width $W_6$ of about 26 mm. As described below in greater detail, a plurality of discrete devices 801 are bonded to each of the integrated circuit dies 701 using corresponding connectors 401.

Figure 8A:
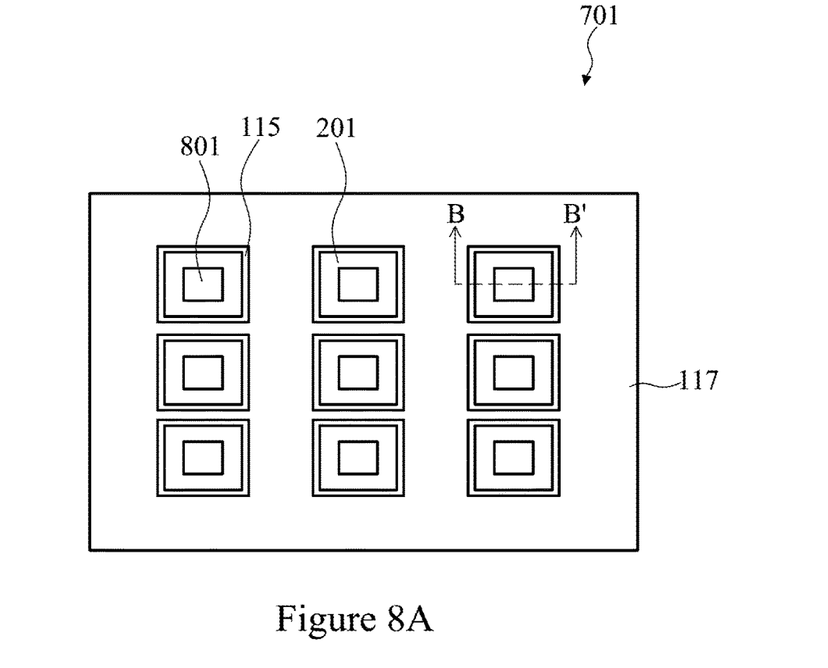
FIGS. 8A and 8B are top and cross-sectional views a plurality of discrete devices coupled to an integrated circuit die using connector structures in accordance with some embodiments.
Figure 8B:
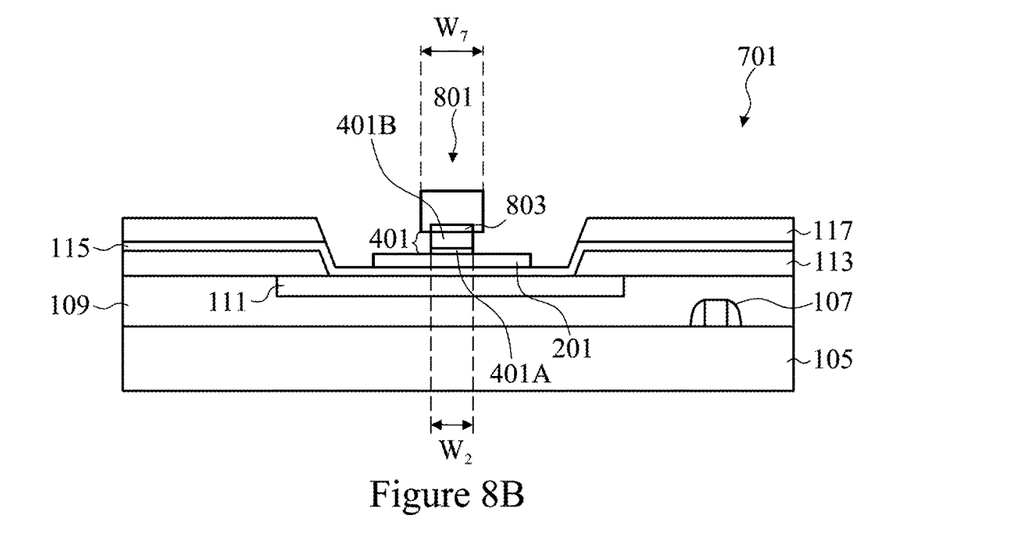

FIGS. 8A and 8B are top and cross-sectional views a plurality of discrete devices 801 coupled to an integrated circuit die 701 using connectors 401 in accordance with some embodiments. In some embodiments, the discrete devices 801 comprise contact pads 803 configured to be bonded to respective connectors 401. The discrete devices 801 may be formed on a wafer, which is subsequently singulated into individual discrete devices. The contact pads 803 may comprise a conductive material such as aluminum, copper, tungsten, silver, gold, the like, or a combination thereof and may be formed over using, for example, physical vapor deposition (PVD), atomic layer deposition (ALD), electro-chemical plating, electroless plating, the like, or a combination thereof. In some embodiments, the discrete devices 801 may be discrete components such as light-emitting diodes (LEDs), photo-sensitive diodes, micro drivers or other micro electrical components. In some embodiments, the discrete devices 801 have a width $W_7$ between about 10 μm and about 20 μm. In some embodiments, the width $W_7$ of the discrete devices 801 may be greater than the width $W_2$ of the connectors 401. In some embodiments, the contact pads 803 and corresponding connectors 401 may be bonded through bonding mechanisms such as a reflow process, eutectic alloy bonding, transient liquid phase bonding, solid state diffusion bonding, or the like. In the illustrated embodiment, the discrete devices 801 are bonded to the integrated circuit dies 701 after dicing the workpiece 100 into the integrated circuit dies 701. In other embodiments, the discrete devices 801 may be bonded to the integrated circuit dies 701 before dicing the workpiece 100 into the integrated circuit dies 701.

Thereafter, in some embodiments, further manufacturing steps may be performed on the integrated circuit dies 701. In some embodiments in which the discrete devices 801 are LEDs, the further manufacturing steps form an LED display. In some embodiments, the further manufacturing steps may include formation of a contact layer over the LEDs, formation of one or more redistribution layers (RDLs) on a front side and/or a backside of the integrated circuit dies 701, formation of UBMs over the RLDs, and formation of connectors over the UBMs. Subsequently, the integrated circuit dies 701 may be attached to a package substrate or a printed circuit board using the connectors.

Figure 9:
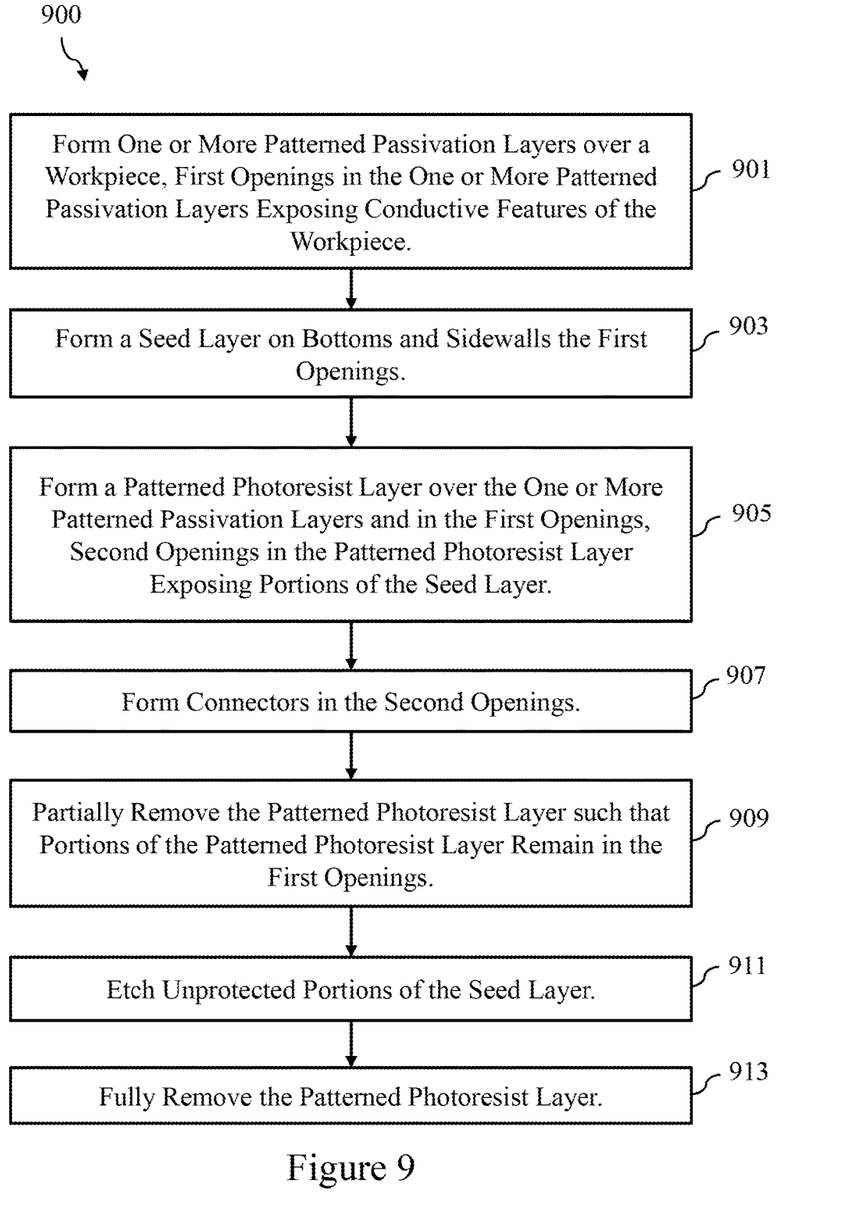
FIG. 9 is a flow diagram illustrating a method of forming connector structures on integrated circuit dies in accordance with some embodiments.

FIG. 9 is a flow diagram illustrating a method 900 of forming connector structures on integrated circuit dies in accordance with some embodiments. The method 900 starts with step 901, where one or more patterned passivation layers (such as the first passivation layer 113 and the second passivation layer 117) are formed over a workpiece (such as the workpiece 100) as described above with reference to FIGS. 1A and 1B. First openings (such as the openings) in the one or more passivation layer expose conductive features (such as the conductive features 111) of the workpiece as described above with reference to FIGS. 1A and 1B. In step 903, a seed layer (such as the seed layer 201) is formed on bottoms and sidewalls of the first openings as described above with reference to FIGS. 2A and 2B. In step 905, a patterned photoresist layer (such as the photoresist layer 301) is formed over the one or more patterned passivation layers and in the first openings, with the patterned photoresist layer having second openings exposing portions of the seed layer as described above with reference to FIGS. 3A and 3B. In step 907, connectors (such as the connectors 401) are formed in the second openings as described above with reference to FIGS. 4A and 4B. In step 909, the pattered photoresist layer is partially removed such that portions of the pattered photoresist layer (such as the unremoved portions 301u of the photoresist layer 301) remain in the first openings as described above with reference to FIGS. 5A and 5B. In step 911, the seed layer is etched using the unremoved portions of the patterned photoresist layer as an etch mask as described above with reference to FIGS. 6A and 6B. In step 913, the patterned photoresist layer is fully removed as described above with reference to FIGS. 7A and 7B. Subsequently, in some embodiments, the workpiece is singulated into individual integrated circuit dies (such as the integrated circuit dies 701) as described above with reference to FIGS. 7A and 7B. In some embodiments, discrete devices (such as the discrete devices 801) are bonded to the integrated circuit dies using corresponding connectors as described above with reference to FIGS. 8A and 8B.

Illustrated embodiments described herein provide various advantages. For example, various embodiments described above allow for forming interconnect structures on integrated circuit dies such that undercut formation between connector structures and corresponding contact pads of integrated circuit dies is reduced or avoided. By controlling undercut formation, failure of connector structures such as formation cracks between connector structures and corresponding contact pads of integrated circuit dies is also reduced or avoided. Various embodiments described above are particularly advantageous for forming connector structures having a fine pitch and size, since connector structures having a fine pitch and size are more prone to failure due to undercut formation.

In accordance with an embodiment, a method includes forming a first patterned passivation layer on a workpiece, the first patterned passivation layer having a first opening exposing a conductive feature of the workpiece. A seed layer is formed over the first patterned passivation layer and in the first opening. A patterned mask layer is formed over the seed layer, the patterned mask layer having a second opening exposing the seed layer, the second opening overlapping with the first opening. A connector is formed in the second opening. The patterned mask layer is partially removed, an unremoved portion of the patterned mask layer remaining in the first opening. The seed layer is patterned using the unremoved portion of the patterned mask layer as a mask.

In accordance with another embodiment, a method includes depositing a first patterned passivation layer having a first opening on a workpiece, the first opening exposing a conductive feature of the workpiece. A protective layer is deposited over the first patterned passivation layer, and along a bottom and sidewalls of the first opening. A second patterned passivation layer having a second opening is deposited over the first patterned passivation layer, the second opening exposing the first opening, the second opening and the first opening forming a combined opening. A seed layer is deposited over the second patterned passivation layer and in the combined opening. A patterned mask layer having a third opening is deposited over the second patterned passivation layer and in the combined opening, the third opening exposing the seed layer, the third opening being within the combined opening. A conductive material is deposited in the third opening to form a connector in the third opening. The patterned mask layer is etched until a topmost surface of the seed layer is exposed, at least a portion of the seed layer in the combined opening being protected by a remaining portion of the patterned mask layer. Exposed portions of the seed layer are etched using the remaining portion of the patterned mask layer as an etch mask. The remaining portion of the patterned mask layer is etched.

In accordance with yet another embodiment, a structure includes an integrated circuit die having a first passivation layer, the first passivation layer having a first opening therein, and a conductive feature on the integrated circuit die, at least a portion of the conductive feature being exposed through the first opening. The structure further includes a seed layer on the conductive feature, and a connector on the seed layer, a width of the seed layer being greater than a width of the connector.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    forming a first patterned passivation layer on a workpiece, the first patterned passivation layer having a first opening exposing a conductive feature of the workpiece;
    forming a seed layer over the first patterned passivation layer and in the first opening;
    forming a patterned mask layer over the seed layer, the patterned mask layer having a second opening exposing the seed layer, the second opening overlapping with the first opening;
    forming a connector in the second opening;
    partially removing the patterned mask layer, an unremoved portion of the patterned mask layer remaining in the first opening; and
    patterning the seed layer using the unremoved portion of the patterned mask layer as a mask.

2. The method of claim 1, further comprising removing the unremoved portion of the patterned mask layer.

3. The method of claim 2, wherein a width of the unremoved portion of the patterned mask layer is greater than a width of the connector.

4. The method of claim 1, further comprising bonding a discrete device to the workpiece using the connector.

5. The method of claim 1, wherein a thickness of the patterned mask layer in the first opening is greater than a thickness of the patterned mask layer over the first patterned passivation layer.

6. The method of claim 1, further comprising:
    forming a protective layer over the first patterned passivation layer, and along a bottom and sidewalls of the first opening; and
    forming a second patterned passivation layer over the protective layer.

7. The method of claim 1, wherein partially removing the patterned mask layer comprises exposing portion of the seed layer disposed over the first patterned passivation layer.

8. The method of claim 1, further comprising boding a discrete device to the workpiece using the connector.

9. A method comprising:
    depositing a first patterned passivation layer having a first opening on a workpiece, the first opening exposing a conductive feature of the workpiece;
    depositing a protective layer over the first patterned passivation layer, and along a bottom and sidewalls of the first opening;
    depositing a second patterned passivation layer having a second opening over the first patterned passivation layer, the second opening exposing the first opening, the second opening and the first opening forming a combined opening;
    depositing a seed layer over the second patterned passivation layer and in the combined opening;
    depositing a patterned mask layer having a third opening over the second patterned passivation layer and in the combined opening, the third opening exposing the seed layer, the third opening being within the combined opening;
    depositing a conductive material in the third opening to form a connector in the third opening;
    etching the patterned mask layer until a topmost surface of the seed layer is exposed, at least a portion of the seed layer in the combined opening being protected by a remaining portion of the patterned mask layer;
    etching exposed portions of the seed layer using the remaining portion of the patterned mask layer as an etch mask; and
    etching the remaining portion of the patterned mask layer.

10. The method of claim 9, wherein the patterned mask layer has an uneven thickness.

11. The method of claim 9, wherein a width of an unetched portion of the seed layer is greater than a width of the connector.

12. The method of claim 9, wherein a width of the remaining portion of the patterned mask layer is greater than a width of an unetched portion of the seed layer.

13. The method of claim 9, wherein a height of the connector is greater than a thickness of the remaining portion of the patterned mask layer.

14. The method of claim 9, wherein etching the exposed portions of the seed layer further comprises forming an undercut between the remaining portion of the patterned mask layer and the conductive feature.

15. A method comprising:
    forming a first passivation layer over an integrated circuit die;
    forming a first opening in the first passivation layer, the first opening exposing a conductive feature on the integrated circuit die, the conductive feature having a first width;
    forming a seed layer over the conductive feature and the first passivation layer;
    forming a photoresist over the seed layer;
    patterning the photoresist with an opening exposing the seed layer, the opening having a second width less than the first width;
    forming a connector in the opening of the photoresist; and
    removing a portion of the seed layer, remaining portions of the seed layer having a third width greater than the second width and less than the first width.

16. The method of claim 15, wherein the remaining portions of the seed layer are interjacent the connector and the conductive feature on the integrated circuit die.

17. The method of claim 15, wherein the removing the portion of the seed layer comprises:
    removing a portion of the photoresist, remaining portions of the photoresist overlying the conductive feature in the first opening; and
    etching the portion of the seed layer outside the remaining portions of the photoresist, the remaining portions of the seed layer underlying the remaining portions of the photoresist.

18. The method of claim 17, wherein the removing the portion of the seed layer further comprises:
    etching sidewalls of the remaining portions of the seed layer to form undercuts beneath the remaining portions of the photoresist.

19. The method of claim 18, wherein the remaining portions of the seed layer have the third width after the etching the sidewalls of the remaining portions of the seed layer.

20. The method of claim 18, further comprising removing the remaining portions of the photoresist after the etching the sidewalls of the remaining portions of the seed layer.

\* \* \* \* \*